(12) United States Patent
VanBuskirk et al.

(10) Patent No.: US 7,894,243 B2
(45) Date of Patent: Feb. 22, 2011

(54) METHODS OF PROGRAMMING AND ERASING RESISTIVE MEMORY DEVICES

(75) Inventors: Michael VanBuskirk, Saratoga, CA (US); Wei Daisy Cai, New York, NY (US); Colin S. Bill, Cupertino, CA (US); Yi-Ching Jean Wu, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 1113 days.

(21) Appl. No.: 11/633,800

(22) Filed: Dec. 5, 2006

(65) Prior Publication Data

US 2008/0130381 A1    Jun. 5, 2008

(51) Int. Cl.
*G11C 11/00* (2006.01)

(52) U.S. Cl. ............ 365/158; 365/185.18; 365/185.19; 365/185.29

(58) Field of Classification Search .................. 365/158, 365/185.19, 185.18, 185.29
See application file for complete search history.

(56) References Cited

U.S. PATENT DOCUMENTS

| | | | | |
|---|---|---|---|---|
| 6,760,266 | B2 * | 7/2004 | Garni et al. | 365/209 |
| 7,145,791 | B2 * | 12/2006 | Tsushima et al. | 365/148 |
| 2005/0248978 | A1 * | 11/2005 | Chen et al. | 365/158 |

* cited by examiner

*Primary Examiner*—Son Dinh (57) ABSTRACT

In a first method of writing data to a resistive memory device (i.e. programming or erasing), successive electrical potentials are applied across the resistive memory device, wherein the successive electrical potentials are of increasing duration. In another method of writing data to a resistive memory device (i.e. programming or erasing), an electrical potential is applied across the resistive memory device, and the level of current through the memory device is sensed as the electrical potential is applied. The application of the electrical potential is ended based on a selected level of current through the resistive memory device.

27 Claims, 11 Drawing Sheets

METHODS OF PROGRAMMING AND ERASING RESISTIVE MEMORY DEVICES

BACKGROUND OF THE INVENTION

1. Technical Field

This invention relates generally to memory devices, and more particularly, to methods of programming and erasing resistive memory devices.

2. Background Art

Figure 1:
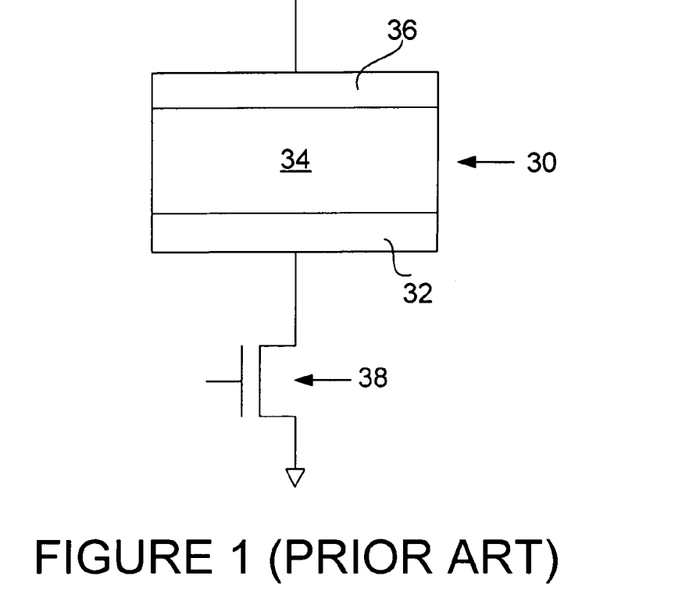
FIG. 1 is a cross-sectional view of the memory device as described above.

FIG. 1 illustrates a memory device 30 known as a metal-insulator-metal (MIM) device which includes an electrode 32, an insulating layer 34 (also known as a switching layer) on and in contact with the electrode 32, and an electrode 36 on and in contact with the insulating layer 32, so the insulating layer 34 is between the electrodes 32, 36. The electrode 32 is connected to the drain of an MOS transistor 38, while the source of the transistor 38 is connected to ground, so that the memory device 30 and transistor 38 are in series.

Figure 2:
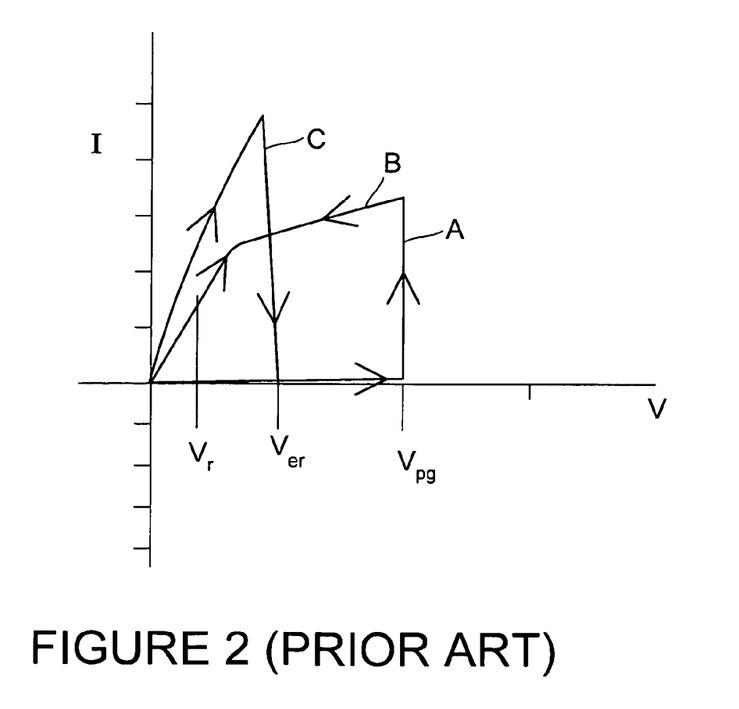
FIG. 2 is a plot of current vs. voltage in the programming, reading and erasing of the memory device of FIG. 1.

Initially, assuming that the memory device 30 is unprogrammed, in order to program the memory device 30, a programming voltage $V_{pg}$ is applied to the electrode 36, so that an electrical potential is applied across the memory device 30 from a higher to a lower potential in the direction from electrode 36 to electrode 32, (see FIG. 2, a plot of memory device current vs. voltage applied to the electrode 36 of the memory device 30). This voltage $V_{pg}$ is sufficient to cause charge carriers to be moved into the insulating layer 34, causing the insulating layer 34 (and the overall memory device 30) to rapidly switch to a low-resistance or conductive state (A). Upon removal of such potential, the charge carriers moved into the insulating layer 34 during the programming step remain therein, so that the insulating layer 34 (and memory device 30) remain in a conductive or low-resistance state, as indicated by the on-state resistance characteristic (B). The voltage $V_{ga}$ applied to the gate of the transistor 38 determines the magnitude of current through the memory device 30 during the programming step.

In order to erase the memory device 30, a positive voltage $V_{er}$ is applied to the electrode 36, so that an electrical potential is applied across the memory device 30 from a higher to a lower electrical potential in the same direction as in programming the device 30. This potential $V_{er}$ is sufficient to cause charge carriers to move from the insulating layer 34, in turn causing the insulating layer 34 (and the overall memory device 30) to be in a high-resistance or substantially non-conductive state. This state remains upon removal of such potential from the memory device 30. The gate voltage $V_{gb}$ again determines the magnitude of current through the memory device 30. As illustrated, the erase voltage $V_{er}$ is lower than the programming voltage $V_{pg}$, and the current provided through the memory device 30 during the erase step (C) is higher than the current through the device 30 during the programming step (based on a higher gate voltage during the erase step than during the programming step).

FIG. 2 also illustrates the read step of the memory device 30 in its programmed (conductive) state and in its erased (nonconductive) state. A voltage $V_r$ is applied to the electrode 36 so that an electrical potential across the memory device 30 from a higher to a lower electrical potential in the same direction as in the programming and erase steps. This voltage $V_r$ is lower than the voltage $V_{pg}$ applied for programming and is lower than the voltage $V_{er}$ applied for erasing (see above). In this situation, if the memory device 30 is programmed, the memory device 30 will readily conduct current, indicating that the memory device 30 is in its programmed state. If the memory device 30 is erased, the memory device 30 will not conduct current, indicating that the memory device 30 is in its erased state.

Figure 3:
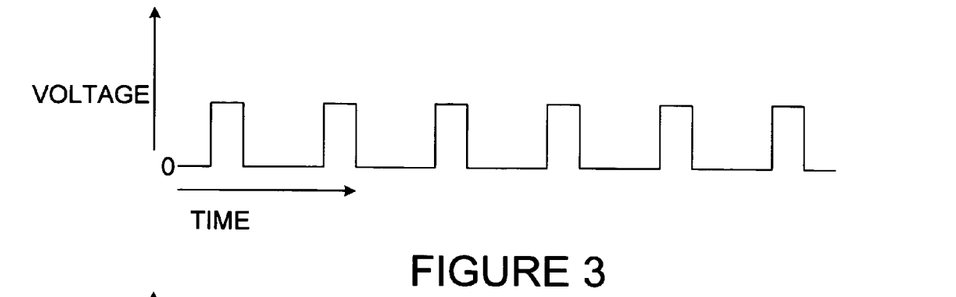
FIG. 3 is a graph illustrating voltage applied to the resistive memory device of FIG. 1 in programming such device.
Figure 4:
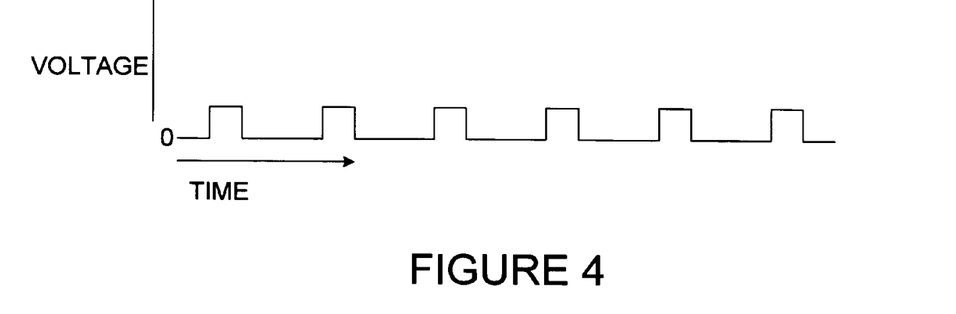
FIG. 4 is a graph illustrating voltage applied to the resistive memory device of FIG. 1 in erasing such device.

Typically, programming and erasing of a memory device is achieved by applying a fixed number of voltage pulses at constant height across the device 30 (programming, FIG. 3, erasing, FIG. 4). Because of physical differences between memory devices in a memory device array, the electrical potential required to achieve programming and erasing can vary between memory devices. This can result in the situation illustrated in FIG. 5, wherein, for a given current, the resistance characteristics of the programmed and erased memory devices are relatively widely distributed. A narrower distribution, for example substantially between the lines J, K for program and between the lines L, K. M for erase, would provide improved definition of the programmed and erase states. This would provide improved readability of the memory device in either such state, as reading of devices would give substantially consistent results from device to device (in the form of substantially equal read currents from device to device).

Therefore, what is needed is an approach wherein such improved operational characteristics are achieved.

DISCLOSURE OF THE INVENTION

Broadly stated, in a method of writing data to a resistive memory device, the method comprises applying successive electrical potentials across the resistive memory device, wherein the successive electrical potentials are of increasing duration.

Broadly stated, in another method of writing data to a resistive memory device, the method comprises applying an electrical potential across the resistive memory device, sensing the level of current through the memory device as the electrical potential is applied, and ending the application of the electrical potential based on a selected level of current through the resistive memory device.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Figure 6:
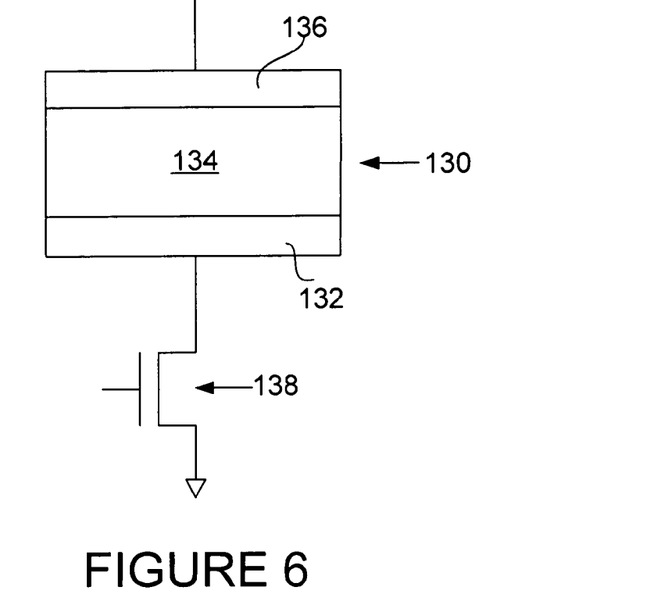
FIG. 6 is a cross-sectional view of the present memory device.

FIG. 6 illustrates the present resistive memory device 130. Similar to the previously shown and described device 30, the resistive memory device 130 includes an electrode 132 (for example copper), an insulating layer 134, for example a copper oxide layer, on and in contact with the electrode 132, and an electrode 136 (for example nickel) on and in contact with the insulating layer 134. The electrode 132 is connected to the drain of an access MOS transistor 138, which has its source connected to ground.

Figure 7:
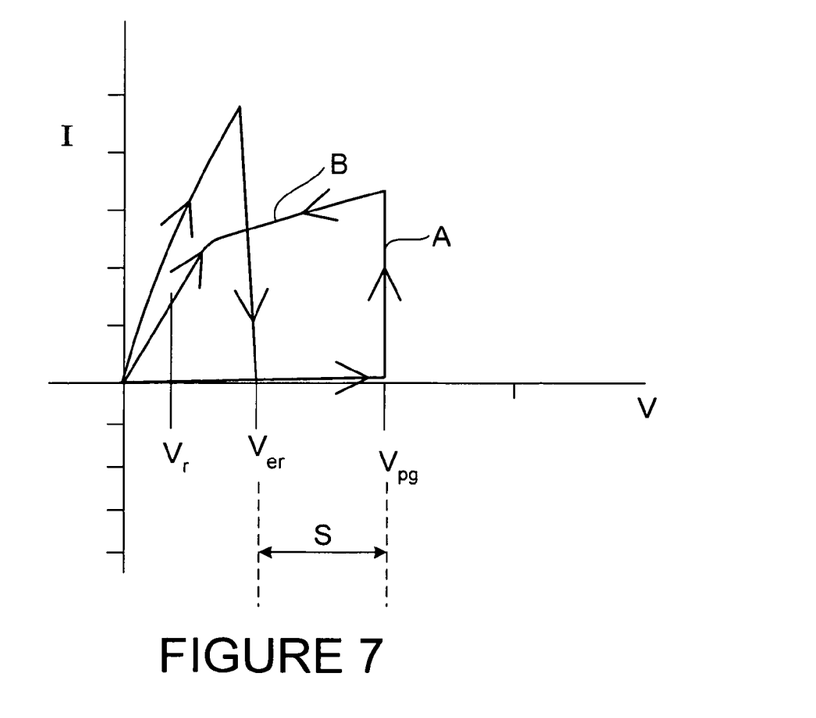
FIG. 7 is a plot of current vs. voltage in the programming, reading and erasing of the memory device of FIG. 6.

FIG. 7 is a plot of memory device current vs. electrical potential applied across the memory device 130. In order to write data to the memory device by programming the device, a positive voltage is applied to electrode 136, so that an electrical potential $V_{pg}$ (the "programming" electrical potential) is applied across the memory device 130 from a higher to a lower electrical potential in the direction from electrode 136 to electrode 132. This causes electronic charge carriers in the form of electrons and/or holes to enter the insulating layer 134 and fill traps in layer 134, to provide that the overall memory device 130 is in a conductive, low-resistance (programmed) state (A). Upon removal of such potential the memory device 130 remains in a conductive or low-resistance state having an on-state resistance indicated at (B), due to the long retention associated with deep trap levels.

In order to write data to the memory device by erasing the device, an electrical potential $V_{er}$ (the "erase" electrical potential) is applied across the memory device 130 from a higher to a lower electrical potential in the direction of from electrode 132 to electrode 136. Application of this electrical potential causes electronic charge carriers to leave the traps in the insulating layer 134, so that the overall memory device is in a high-resistance (erased) state.

Figure 8:
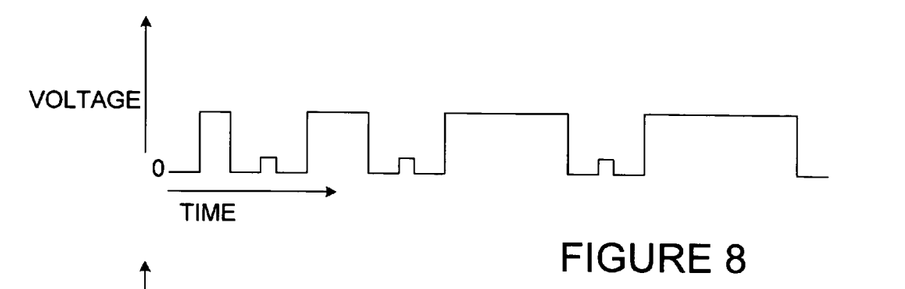
FIGS. 8-11 are graphs illustrating various voltages applied to the resistive memory device of FIG. 6 in programming such device.

In a first embodiment of the invention, a method of programming the memory device 130 is provided. Initially, a constant voltage is applied to the gate of the transistor 138. This electrical potential is maintained while individual, successive electrical potentials of constant magnitude and increasing duration, in the form of voltage pulses, are applied to the electrode 136 of the device 130 (FIG. 8). These voltage pulses are separated by periods during which a smaller (read) voltage is applied to the electrode 136 to sense the state of the memory device 130.

Figure 12:
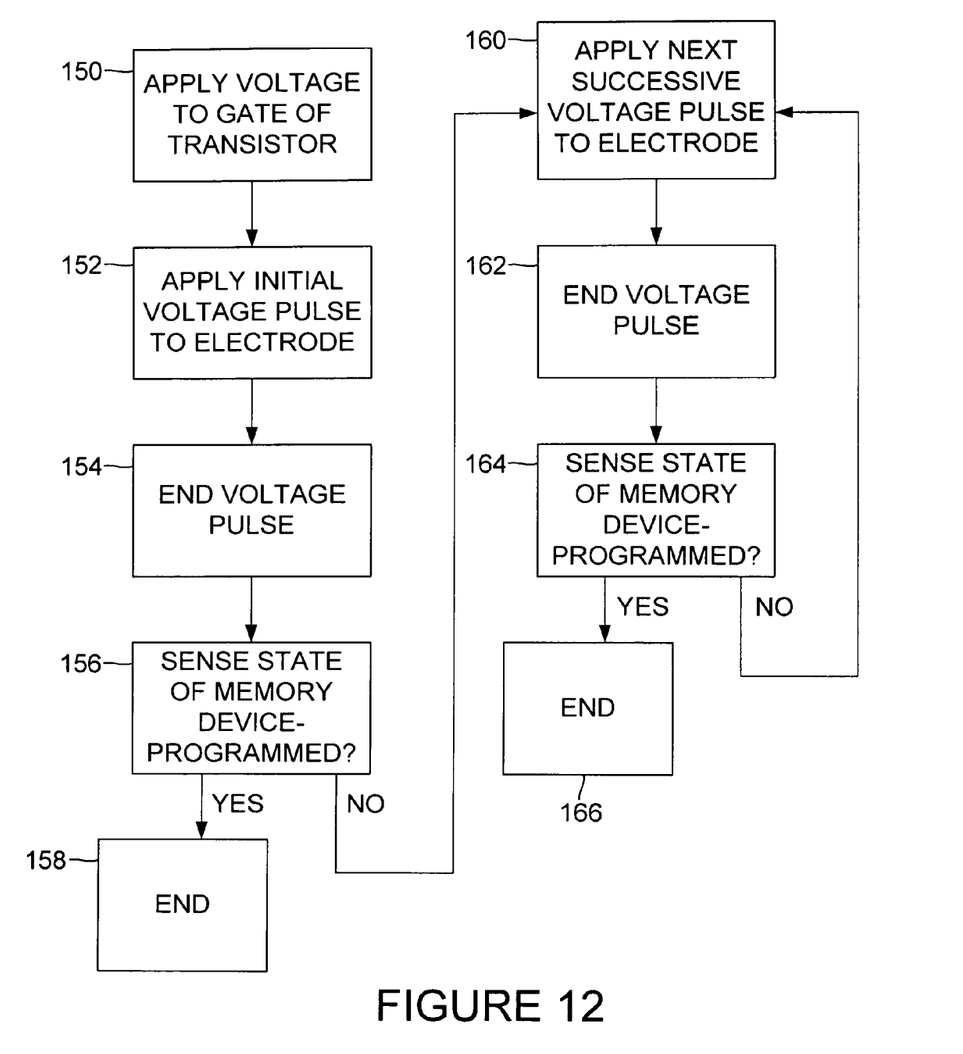
FIG. 12 is a flow chart illustrating steps in the methods of FIGS. 8-11.

By way of example, it is assumed that the present memory device 130 can be programmed by applying the duration of voltage of the third voltage pulse applied to the electrode 136, but is not programmed by applying the duration of voltage of the second voltage pulse to the electrode 136. Application of the next, fourth voltage pulse to the electrode 136 may result in over-programming. In order to avoid this problem, and with reference to FIG. 12, in the present process, after the voltage is applied to the gate of the transistor 138 as described above (150), the initial voltage pulse is applied to the electrode 136 (152). After the first voltage pulse is ended (154), and before the beginning of the second, longer duration voltage pulse, the state of the memory device 130 is sensed by providing a read potential thereacross to determine if programming has been achieved (156). If so, application of voltage to the electrode 136 is ended (158), and the device 130 can be considered programmed. On the other hand, if such programming has not been achieved, the next successive (second) voltage pulse, greater in duration than the initial voltage pulse, is applied to the electrode 136 (160). After this second voltage pulse is ended (162), and before the beginning of the third, greater duration voltage pulse, the state of the memory device 130 is sensed by providing a read potential thereacross to determine if programming has been achieved (164). Again, if the device 130 has been so programmed, application of voltage to electrode 136 is ended (166), and the device 130 can be considered programmed. If such programming has not been achieved, the process is continued as illustrated in FIG. 12 until programming of the device 130 has been achieved (in this example after the third voltage pulse but before the fourth voltage pulse).

Only the minimum number of successive voltage pulses of increasing duration applied to the electrode 136 are needed and used to program the device 130. This approach allows for efficient programming of devices which may have different programming characteristics. That is, as the duration of voltage on the electrode 136 is increased through application of the successive voltage pulses, the programming process ends as soon as the pulse applied to the electrode 136 is of sufficient duration to properly program the device 130. This approach avoids the disturb problem described above.

Figure 9:
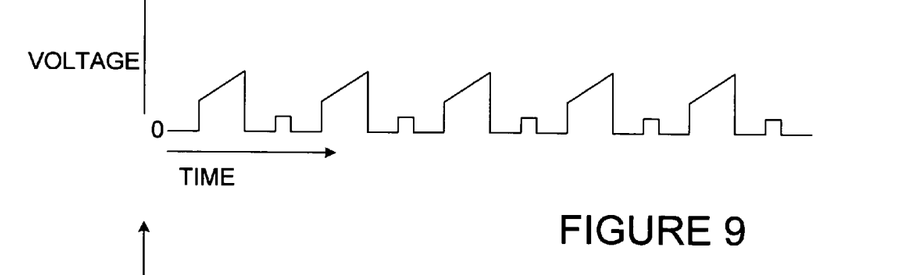

In another programming embodiment, a constant voltage is applied to the gate of the transistor 138 and is maintained thereon. Meanwhile, individual, identical successive electrical potentials of equal duration, in the form of voltage pulses, are applied to the electrode 136 of the device 130 (FIG. 9). The electrical potential for each pulse increases in magnitude with time, so that each pulse has an upwardly ramped portion during the duration thereof. These voltage pulses are separated by periods during which a smaller (read) voltage is applied to the electrode 136. Similar to the previous embodiment, the process steps of the flow chart of FIG. 12 and the advantages attendant to the previous embodiment apply to the present process.

Figures 10, 11:
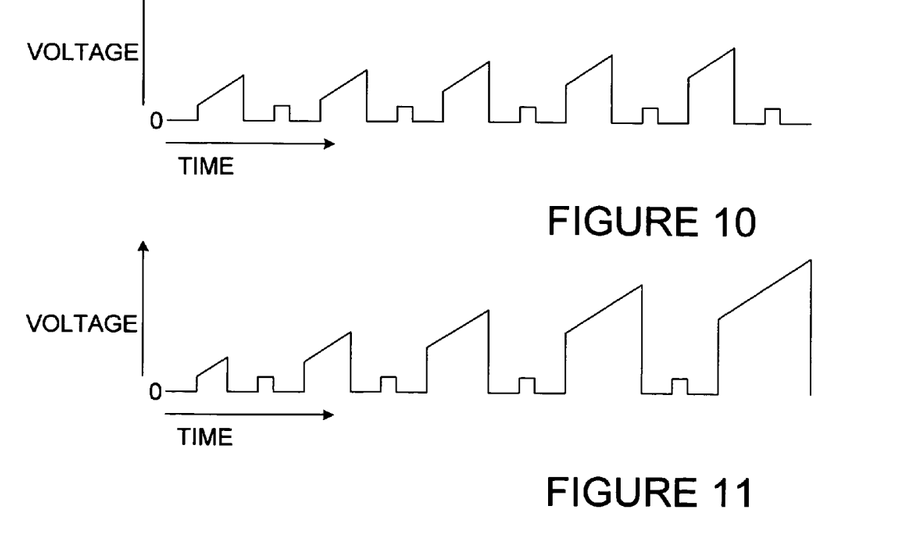

In another programming embodiment, a constant voltage is applied to the gate of the transistor 138 and is maintained thereon. Meanwhile, individual, successive electrical potentials of equal duration, in the form of voltage pulses, are applied to the electrode 136 of the device 130 (FIG. 10). The electrical potential for each pulse increases in magnitude with time, so that each pulse has an upwardly ramped portion during the duration thereof. Additionally, each ramped portion starts at a magnitude greater than the magnitude of the immediately preceding pulse at its start, and each successive electrical potential goes to a higher magnitude than the greatest magnitude of the immediately preceding pulse. These voltage pulses are separated by periods during which a smaller (read) voltage is applied to the electrode 136. Similar to the previous embodiments, the process steps of the flow chart of FIG. 12 and the advantages attendant to the previous embodiments apply to the present process.

In another programming embodiment, a constant voltage is applied to the gate of the transistor 138 and is maintained thereon. Meanwhile, individual, successive electrical potentials, in the form of voltage pulses, are applied to the electrode 136 of the device 130 (FIG. 11). These pulses have the characteristics of the pulses of FIG. 10, but instead of the pulses being of equal duration, the successive pulses are of increasing duration. Similar to the previous embodiments, the process steps of the flow chart of FIG. 12 and the advantages attendant to the previous embodiments apply to the present process.

Figure 13:
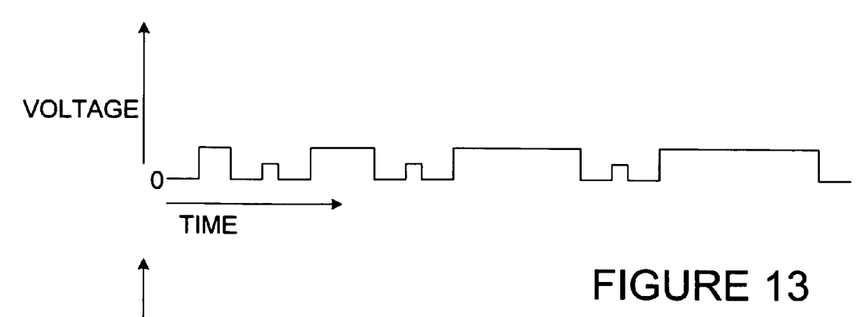
FIGS. 13-16 are graphs illustrating various voltages applied to the resistive memory device of FIG. 6 in erasing such device.

In another embodiment of the invention, a method of erasing the memory device 130 is provided. Initially, a constant voltage is applied to the gate of the transistor 138. This gate voltage is typically higher than the voltage applied during programming. This electrical potential is maintained while individual, successive electrical potentials of constant magnitude and increasing duration, in the form of voltage pulses, are applied to the electrode 136 of the device 130 (FIG. 13). These voltage pulses are separated by periods during which a smaller (read) voltage is applied to the electrode 136 to sense the state of the memory device 130.

Figure 17:
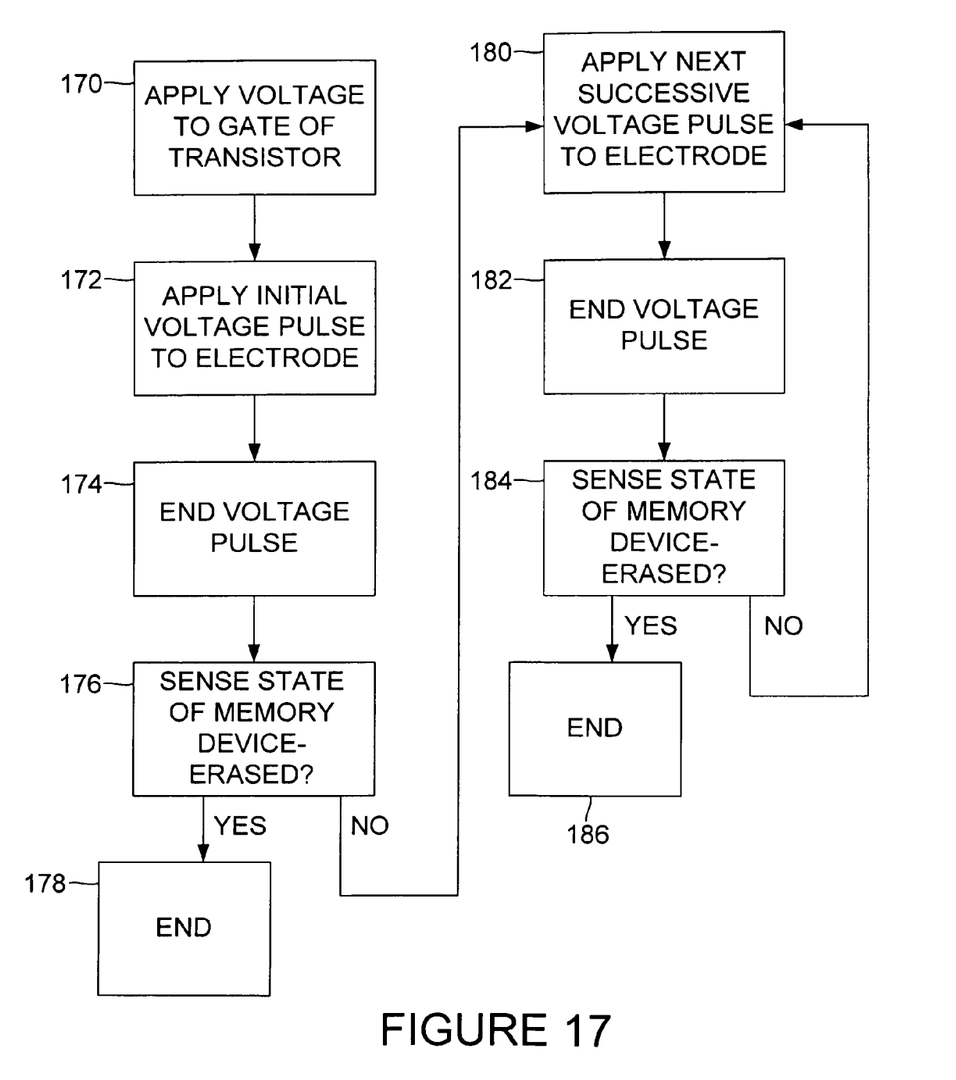
FIG. 17 is a flow chart illustrating steps in the methods of FIGS. 13-16.

By way of example, it is assumed that the present memory device 130 can be erased by applying the duration of voltage of the third voltage pulse applied to the electrode 136, but is not erased by applying the duration of voltage of the second voltage pulse to the electrode 136. Application of the next, fourth voltage pulse to the electrode 136 may result in over-erasing. In order to avoid this problem, and with reference to FIG. 17, in the present process, after the voltage is applied to the gate of the transistor 138 as described above (170), the initial voltage pulse is applied to the electrode 136 (172). After the first voltage pulse is ended (174), and before the beginning of the second, longer duration voltage pulse, the state of the memory device 130 is sensed by providing a read potential thereacross to determine if erasing has been achieved (176). If so, application of voltage to the electrode 136 is ended (178), and the device 130 can be considered erased. On the other hand, if such erasing has not been achieved, the next successive (second) voltage pulse, greater in duration than the initial voltage pulse, is applied to the electrode 136 (138). After this second voltage pulse is ended (182), and before the beginning of the third, greater duration voltage pulse, the state of the memory device 130 is sensed by providing a read potential thereacross to determine if erasing has been achieved (184). Again, if the device 130 has been so erased, application of voltage to electrode 136 is ended (186), and the device 130 can be considered erased. If such erasing has not been achieved, the process is continued as illustrated in FIG. 17 until erasing of the device 130 has been achieved (in this example after the third voltage pulse but before the fourth voltage pulse).

Only the minimum number of successive voltage pulses of increasing duration applied to the electrode 136 are needed and used to erase the device 130. This approach allows for efficient erasing of devices which may have different erase characteristics. That is, as the duration of voltage on the electrode 136 is increased through application of the successive voltage pulses, the erasing process ends as soon as the pulse applied to the electrode is of sufficient duration to properly erase the device 130. This approach avoids the disturb problem described above.

Figure 14:
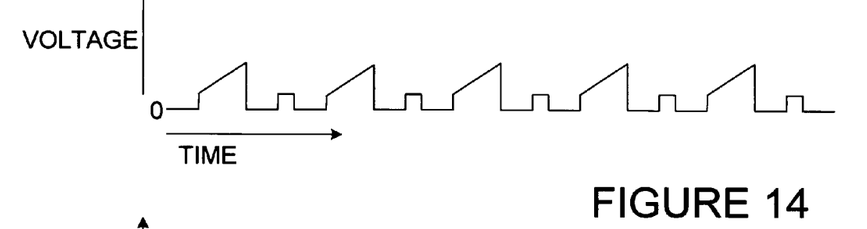

In another erase embodiment, a constant voltage is applied to the gate of the transistor 138 and is maintained thereon. Meanwhile, individual, identical successive electrical potentials of equal duration, in the form of voltage pulses, are applied to the electrode 136 of the device 130 (FIG. 14). The electrical potential for each pulse increases in magnitude with time, so that each pulse has an upwardly ramped portion during the duration thereof. These voltage pulses are separated by periods during which a smaller (read) voltage is applied to the electrode 136. Similar to the previous embodiment, the process steps of the flow chart of FIG. 17 and the advantages attendant to the previous embodiment apply to the present process.

Figure 15:
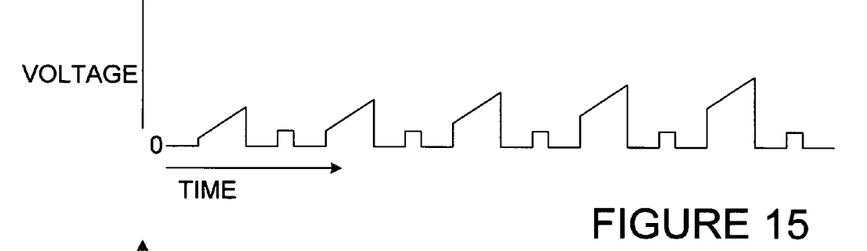

In another erase embodiment, a constant voltage is applied to the gate of the transistor 138 and is maintained thereon. Meanwhile, individual, successive electrical potentials of equal duration, in the form of voltage pulses, are applied to the electrode 136 of the device 130 (FIG. 15). The electrical potential for each pulse increases in magnitude with time, so that each pulse has an upwardly ramped portion during the duration thereof. Additionally, each ramped portion starts at a magnitude greater than the magnitude of the immediately preceding pulse at its start, and each successive electrical potential goes to a higher magnitude than the greatest magnitude of the immediately preceding pulse. These voltage pulses are separated by periods during which a smaller (read) voltage is applied to the electrode 136. Similar to the previous embodiments, the process steps of the flow chart of FIG. 17 and the advantages attendant to the previous embodiments apply to the present process.

Figure 16:
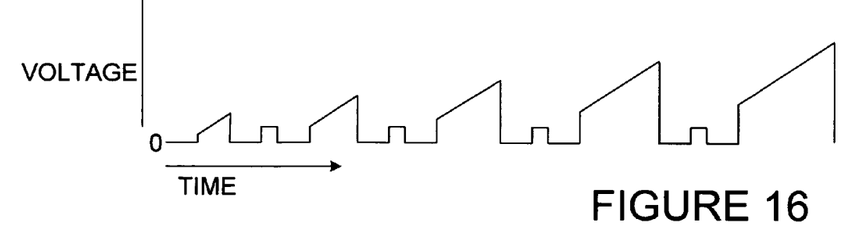

In another erase embodiment, a constant voltage is applied to the gate of the transistor 138 and is maintained thereon. Meanwhile, individual, successive electrical potentials, in the form of voltage pulses, are applied to the electrode 136 of the device 130 (FIG. 16). These pulses have the characteristics of the pulses of FIG. 15, but instead of the pulses being of equal duration, the successive pulses are of increasing duration. Similar to the previous embodiments, the process steps of the flow chart of FIG. 17 and the advantages attendant to the previous embodiments apply to the present process.

Figure 18:
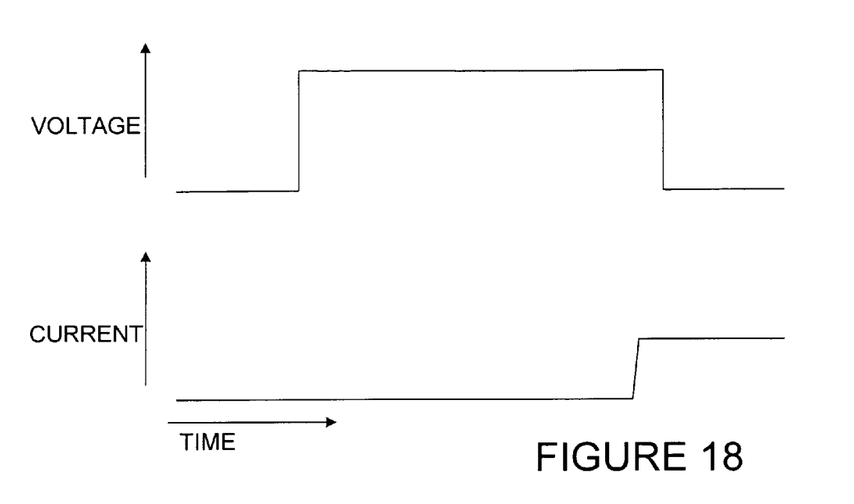
FIG. 18 is a graph illustrating voltage and current for programming the resistive memory device of FIG. 6 in accordance with another embodiment of the invention.
Figure 19:
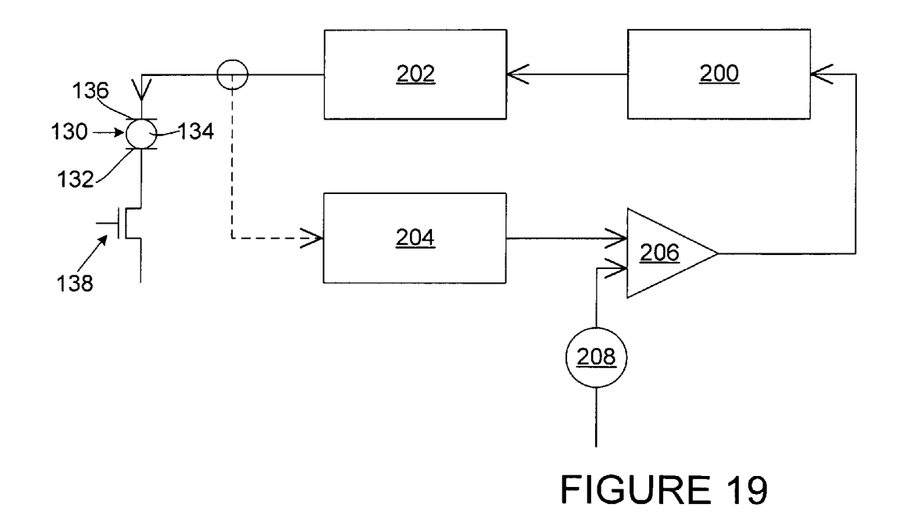
FIG. 19 is a schematic illustration of circuitry as used for programming the resistive memory device in accordance with FIG. 18.
Figure 20:
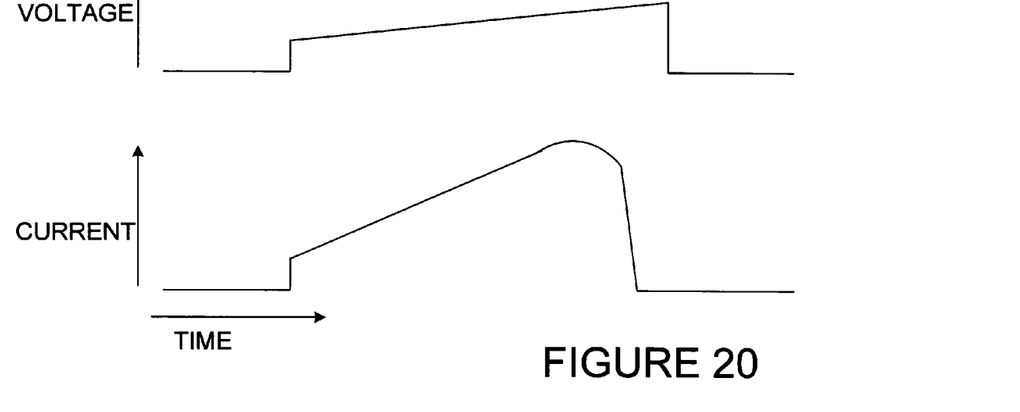
FIG. 20 is a graph illustrating voltage and current for erasing the resistive memory device of FIG. 6 in accordance with another embodiment of the invention.

FIGS. 18, 19 and 20 illustrate another approach to programming and erasing a resistive memory device 130. With reference to FIGS. 18 and 19, a resistive memory device 130 and transistor 138, similar to the resistive memory device and transistor of FIG. 6, are shown. In programming the device 130, a voltage is applied to the gate of the transistor 138. During this application, logic 200 instructs a voltage driver 202 to supply a voltage of constant magnitude to the electrode 136 of the resistive memory device 130, so that a constant electrical potential is applied across the device 130. As this voltage is applied, after a period of time, current will start to flow through the device 130. The level of current through the device 130 is sensed by a current sensor 204 which provides such information to a comparator 206 where it is compared with information on a selected level of current supplied by a current source 208. When the current through the device 130 reaches a selected level, i.e. the level of the reference current supplied by current source 208, in this case greater than zero, a signal is issued by the comparator 206 to the logic 200, which in response thereto, substantially immediately after the selected level of current through the device 130 is sensed, directs the voltage driver 202 to end the voltage supplied to the electrode 136, thereby ending the application of the electrical potential across the device 130 and leaving the device 130 in a programmed state.

With reference to FIGS. 19 and 20, in erasing the device 130, a voltage is applied to the gate of the transistor 138. During this application, the logic 200 instructs the voltage driver 202 to supply a voltage of increasing magnitude to the electrode 136 of the resistive memory device 130, so that an increasing electrical potential is applied across the device 130. As this voltage is applied, current flows through the device 130. The level of current through the device 130 is sensed by current sensor 204 which provides such information to comparator 206 where it is compared with information on a selected level of current supplied by current source 208. When the current through the device 130 reaches the selected level, i.e. the level of the reference current supplied by current source 208, in this case close to zero, a signal is issued by the comparator 206 to the logic 200, which in response thereto, substantially immediately after the selected level of current through the device 130 is sensed, directs the voltage driver 202 to end the voltage supplied to the electrode 136, thereby ending the application of the electrical potential across the device 130 (FIG. 20) and leaving the device 130 in an erased state.

Figure 5:
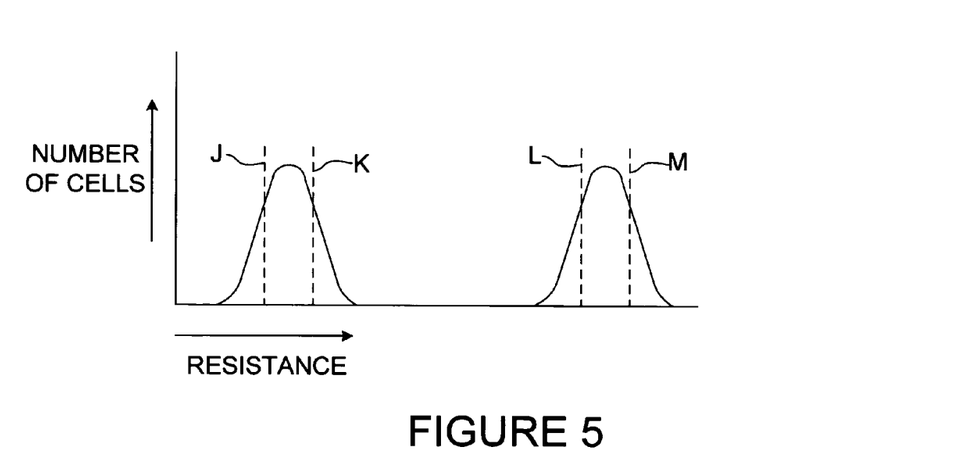
FIG. 5 is a graph illustrating resistance characteristics of the device of FIG. 1 when programmed and erased in accordance with FIGS. 3 and 4.
Figure 21:
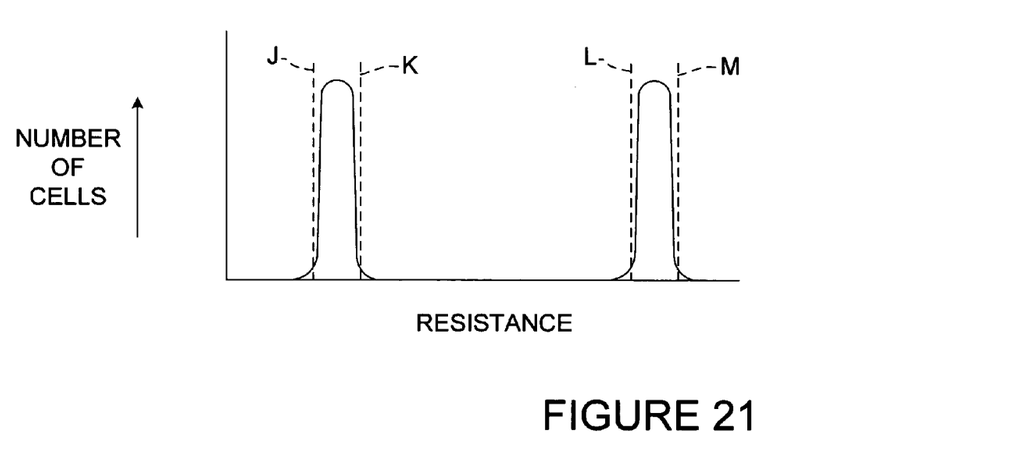
FIG. 21 is a graph illustrating resistance characteristics of the device of FIG. 6 when programmed and erased in accordance with the present methods.

The situation achieved is illustrated in FIG. 21, wherein, for a given current, the resistance characteristics of the programmed and erased memory devices are narrowly distributed (compare FIG. 5, wherein, for a given current, the resistance characteristics of the programmed and erased memory devices are relatively widely distributed). A narrower distribution, for example substantially between the lines J, K for program and between the lines L, M for erase (see also FIG. 5), provides improved definition of the programmed and erase states. This in turn provides improved readability of memory devices 130 in either such state, as reading of devices would give substantially consistent results from device to device (in the form of substantially equal read currents from device to device).

As will be seen in FIG. 7, if $V_{pg}$ is only slightly greater than $V_{er}$ (represented by the difference S), application of excessive voltage to the electrode 136 can cause the device 130, in the erase process, to be undesirably reprogrammed. This possibility is avoided in all the present erase embodiments by ending application of erase voltage before this can happen.

Figures 22, 23:
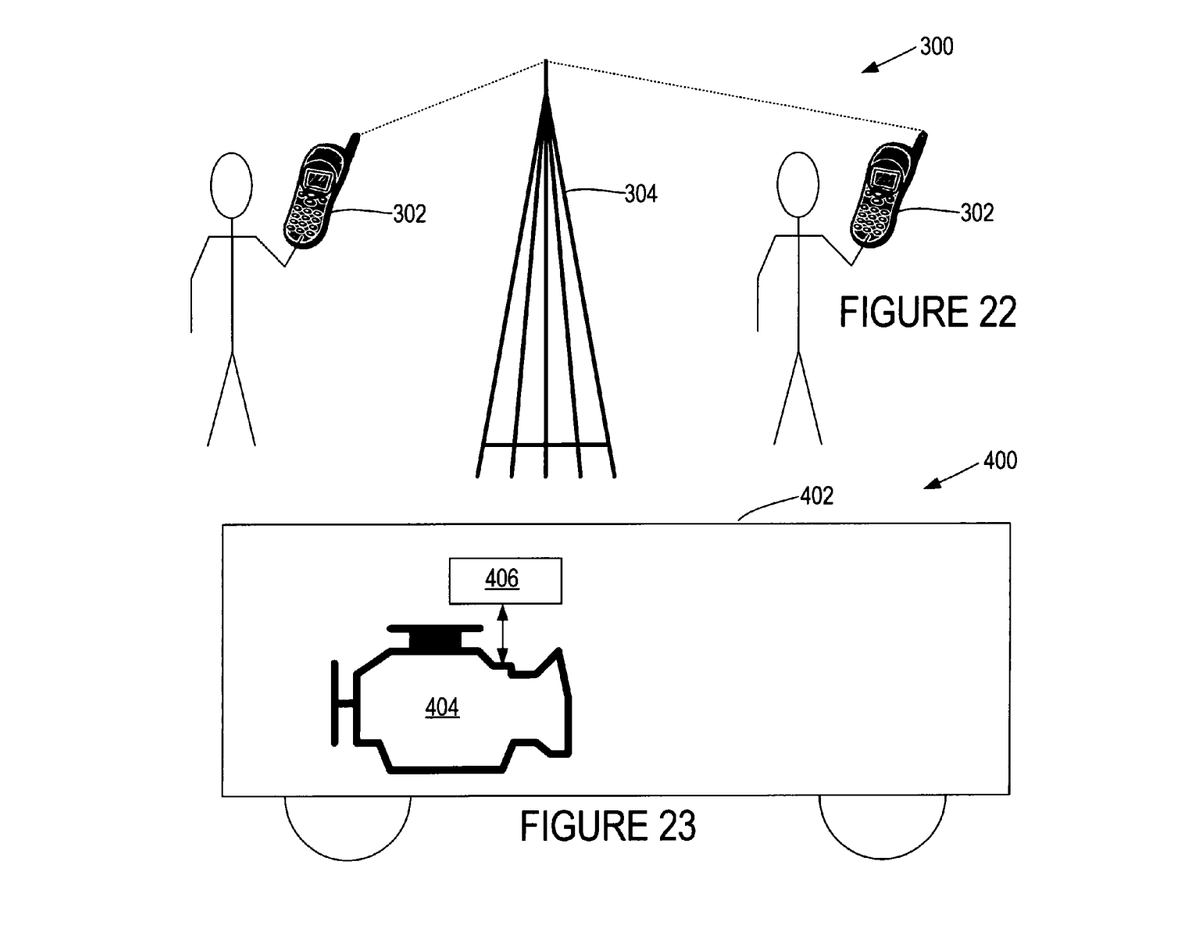
FIGS. 22-24 are systems incorporating memory devices of the present type.

FIG. 22 illustrates a system 300 utilizing memory devices as described above. As shown therein, the system 300 includes hand-held devices in the form of cell phones 302, which communicate through an intermediate apparatus such as a tower 304 (shown) and/or a satellite. Signals are provided from one cell phone to the other through the tower 304. Such a cell phone 302 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 23 illustrates another system 400 utilizing memory devices as described above. The system 400 includes a vehicle 402 having an engine 404 controlled by an electronic control unit 406. The electronic control unit 406 with advantage uses memory devices of the type described above for data storage, for example data relating to engine and vehicle operating conditions.

Figure 24:
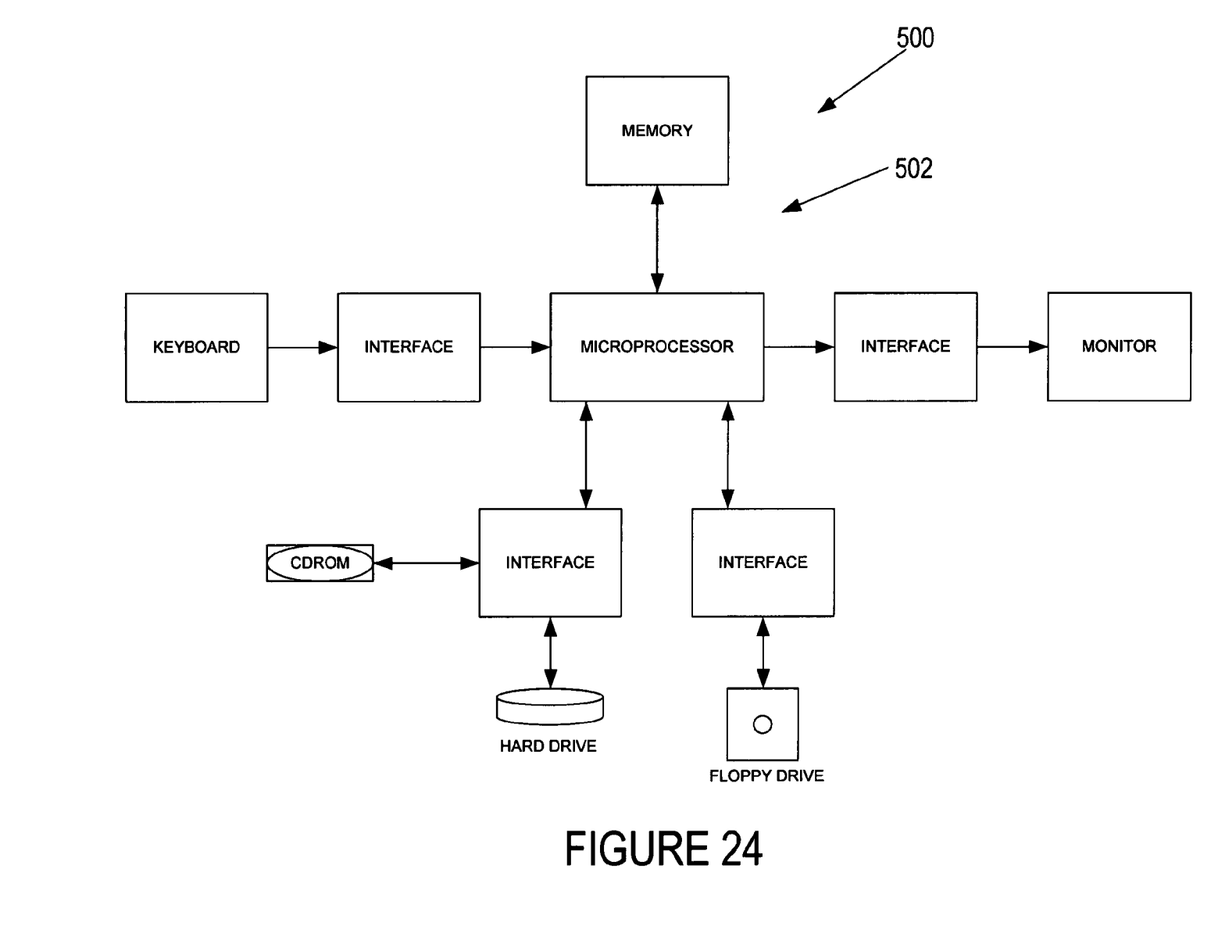

FIG. 24 illustrates yet another system 500 utilizing memory devices as described above. This system 500 is a computer 502 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of writing data to a resistive memory device comprising:
applying successive electrical potentials across the resistive memory device, wherein the successive electrical potentials are of increasing duration.

2. The method of claim 1 and further comprising applying the minimum number of successive electrical potentials across the resistive memory device to erase the resistive memory device.

3. The method of claim 1 wherein each electrical potential is of constant magnitude during its duration.

4. The method of claim 1 wherein each electrical potential changes in magnitude during its duration.

5. The method of claim 4 wherein each electrical potential increases in magnitude during its duration.

6. The method of claim 5 wherein each successive electrical potential after the initial electrical potential has a portion of greater magnitude than the greatest magnitude of the immediately preceding electrical potential.

7. The method of claim 2 and further comprising sensing the state of the resistive memory device after each application of electrical potential of successive increasing electrical potentials to the resistive memory device.

8. The method of claim 1 wherein the successive increasing potentials are pulsed electrical potentials.

9. The method of claim 1 wherein the resistive memory device comprises first and second electrodes, and an insulating layer between and in contact with the first and second electrodes.

10. The method of claim 1 wherein the writing of data is a programming step.

11. The method of claim 1 wherein the writing of data is an erase step.

12. A method of writing data to a resistive memory device comprising:
applying successive electrical potentials across the resistive memory device, wherein each electrical potential changes in magnitude during its duration.

13. The method of claim 12 and further comprising applying the minimum number of successive electrical potentials across the resistive memory device to erase the resistive memory device.

14. The method of claim 12 wherein each electrical potential increases in magnitude during its duration.

15. The method of claim 12 wherein each successive electrical potential after the initial electrical potential has a portion of greater magnitude than the greatest magnitude of the immediately preceding electrical potential.

16. The method of claim 12 and further comprising sensing the state of the resistive memory device after each application of electrical potential of successive increasing electrical potentials to the resistive memory device.

17. The method of claim 12 wherein the successive increasing electrical potentials are pulsed electrical potentials.

18. The method of claim 12 wherein the resistive memory device comprises first and second electrodes, and an insulating layer between and in contact with the first and second electrodes.

19. The method of claim 12 wherein the writing of data is a programming step.

20. The method of claim 12 wherein the writing of data is an erase step.

21. A method of writing data to a resistive memory device comprising:
applying an electrical potential across the resistive memory device;
sensing the level of current through the memory device as the electrical potential is applied; and
ending the application of the electrical potential based on a selected level of current through the resistive memory device.

22. The method of claim 21 wherein the application of the electrical potential ends substantially immediately after the selected level of current is sensed.

23. The method of claim 21 wherein the writing of data is a programming step.

24. The method of claim 21 wherein the writing of data is an erase step.

25. The method of claim 21 wherein the resistive memory device comprises first and second electrodes, and an insulating layer between and in contact with the first and second electrodes.

26. The method of claim 1 and further comprising said memory device incorporated in a system.

27. The method of claim 26 wherein the system is selected from the group consisting of a hand-held device, a vehicle, and a computer.

* * * * *